(12) United States Patent
Nakano et al.

(10) Patent No.: US 12,114,433 B2
(45) Date of Patent: Oct. 8, 2024

(54) SUBSTRATE, METHOD FOR MANUFACTURING SUBSTRATE, AND ELECTRONIC DEVICE

(71) Applicant: FUJITSU INTERCONNECT TECHNOLOGIES LIMITED, Nagano (JP)

(72) Inventors: Hiroshi Nakano, Nagano (JP); Norikazu Ozaki, Nagano (JP)

(73) Assignee: FUJITSU INTERCONNECT TECHNOLOGIES LIMITED, Nagano (JP)

( * ) Notice: Subject to any disclaimer, the term of this patent is extended or adjusted under 35 U.S.C. 154(b) by 338 days.

(21) Appl. No.: 17/635,756

(22) PCT Filed: May 26, 2020

(86) PCT No.: PCT/JP2020/020644
§ 371 (c)(1),
(2) Date: Feb. 16, 2022

(87) PCT Pub. No.: WO2021/044675
PCT Pub. Date: Mar. 11, 2021

(65) Prior Publication Data
US 2022/0312595 A1      Sep. 29, 2022

(30) Foreign Application Priority Data
Sep. 3, 2019   (JP) ................. 2019-160202

(51) Int. Cl.
*H05K 3/00*     (2006.01)
*H01L 23/498*   (2006.01)
(Continued)

(52) U.S. Cl.
CPC ..... *H05K 3/0094* (2013.01); *H01L 23/49827* (2013.01); *H05K 1/0306* (2013.01);
(Continued)

(58) Field of Classification Search
None
See application file for complete search history.

(56) References Cited

U.S. PATENT DOCUMENTS

| | | | |
|---|---|---|---|
| 2010/0300602 A1* | 12/2010 | Ichiyanagi | H01L 23/50 156/89.12 |
| 2016/0293535 A1 | 10/2016 | Fukasawa et al. | |
| 2016/0316557 A1* | 10/2016 | Lee | H05K 3/0094 |

FOREIGN PATENT DOCUMENTS

| | | |
|---|---|---|
| JP | 5-251834 A | 9/1993 |
| JP | 11-186726 A | 7/1999 |

(Continued)

OTHER PUBLICATIONS

International Search Report dated Aug. 25, 2020, issued in counterpart International Application No. PCT/JP2020/020644 (2 pages).
(Continued)

*Primary Examiner* — Hoa C Nguyen
*Assistant Examiner* — John B Freal
(74) *Attorney, Agent, or Firm* — WHDA, LLP

(57) ABSTRACT

A substrate that enables increasing an allowable current value of a current path in a thickness direction of the substrate and narrowing spaces between multiple current paths, and the like are provided. To solve this subject, a substrate includes a sheet-shaped first base material (1) having a penetrating hole (1B) in the thickness direction and includes a second base material (2) fitted into the penetrating hole (1B). The second base material (2) includes multiple metal bodies (2B). The metal bodies (2B) penetrate in the thickness direction of the first base material (1) in a state of having an end exposed at each of a first surface and a second surface of the second base material (2) that face each other in the thickness direction.

7 Claims, 7 Drawing Sheets

(51) Int. Cl.
     *H05K 1/03*          (2006.01)
     *H05K 1/11*          (2006.01)
     *H05K 3/04*          (2006.01)
     *H05K 3/42*          (2006.01)

(52) U.S. Cl.
     CPC ............ *H05K 1/115* (2013.01); *H05K 3/043* (2013.01); *H05K 3/428* (2013.01)

(56) References Cited

FOREIGN PATENT DOCUMENTS

| | | |
|---|---|---|
| JP | 2001-111195 A | 4/2001 |
| JP | 2015-159160 A | 9/2015 |
| JP | 2016-195238 A | 11/2016 |
| JP | 2016-208000 A | 12/2016 |
| WO | 2006/129848 A1 | 12/2006 |

OTHER PUBLICATIONS

Office Action dated May 15, 2024, issued in counterpart Chinese Patent Application No. 202080058000.0 (12 pages).

\* cited by examiner

SUBSTRATE, METHOD FOR MANUFACTURING SUBSTRATE, AND ELECTRONIC DEVICE

TECHNICAL FIELD

The present invention relates to a substrate, a method for manufacturing the substrate, and an electronic device.

BACKGROUND ART

In recent years, in devices such as a field-programmable gate array (FPGA), consumption of current has been increasing in accordance with reduction in size and increase in functionality. This causes necessity of supplying high current to printed circuit boards on which the devices are mounted.

A printed circuit board has current paths in a plane direction of the board or a thickness direction of the board.

As to the plane direction, allowable current can be increased by increasing the number of layers. On the other hand, as to application of current in the thickness direction of the board, a plated through hole that is formed by plating is generally used. In this case, an allowable current amount depends on thickness of this plating.

CITATION LIST

Patent Literature

PTL 1: JP-A-2015-159160

SUMMARY OF INVENTION

Technical Problem

An object of the technique of the disclosure is to provide a substrate that enables increasing an allowable current value of a current path in a thickness direction of the substrate and narrowing spaces between multiple current paths. Another object of the technique of the disclosure is to provide a method for manufacturing the substrate and to provide an electronic device including the substrate.

Solution to Problem

In one aspect, a substrate of the disclosure includes
a sheet-shaped first base material having a penetrating hole in a thickness direction, and
a second base material fitted into the penetrating hole.
The second base material includes multiple metal bodies. The metal bodies penetrate in the same direction as the thickness direction of the first base material in a state of having an end exposed at each of a first surface and a second surface of the second base material that face each other in the thickness direction.

In another aspect, an electronic device of the disclosure includes the substrate of the disclosure and an electronic component.

In another aspect, a method for manufacturing a substrate of the disclosure includes fitting a second base material into a penetrating hole in a thickness direction of a first sheet-shaped base material.

The second base material, which is fitted into the penetrating hole of the first base material, includes multiple metal bodies. The metal bodies penetrate in the same direction as the thickness direction of the first base material in a state of having an end exposed at each of a first surface and a second surface of the second base material that face each other in the thickness direction.

Advantageous Effects of Invention

According to one aspect, it is possible to provide a substrate that enables increasing an allowable current value of a current path in a thickness direction of the substrate and narrowing spaces between multiple current paths.

According to another aspect, it is possible to provide a method for manufacturing a substrate that enables increasing an allowable current value of a current path in a thickness direction of the substrate and narrowing spaces between multiple current paths.

According to another aspect, it is possible to provide an electronic device including a substrate that enables increasing an allowable current value of a current path in a thickness direction of the substrate and narrowing spaces between multiple current paths.

DESCRIPTION OF EMBODIMENTS (Substrate)

The substrate of the disclosure includes at least a sheet-shaped first base material and a second base material, and moreover includes other components as necessary.

The second base material includes multiple metal bodies. The metal bodies penetrate in the same direction as the thickness direction of the first base material in a state of having an end exposed at each of a first surface and a second surface of the second base material that face each other in the thickness direction.

Herein, plating of a through hole for forming a current path in a thickness direction of a substrate of a printed circuit board will be described.

Figure 11A:
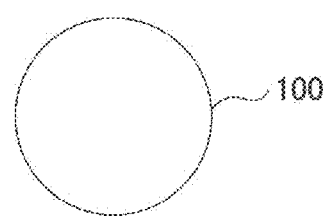
FIG. 11A is a top view of a through hole.
Figure 11B:
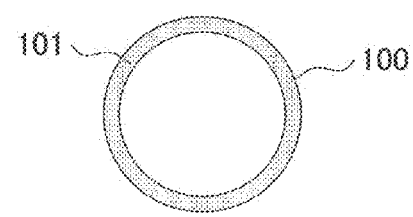
FIG. 11B is a top view of a plated through hole.

FIG. 11A is a top view of a through hole 100. The through hole 100 has a through hole diameter, which is approximately 0.35 mm in diameter ($\varphi$), for example. FIG. 11B is a top view of the through hole 100 having a plating 101. A general thickness of a plating of a through hole is 20 to 30 μm. In general, the plating 101 is formed on an inner wall of the through hole 100 and does not completely fill the whole through hole 100. In the condition that the thickness of the plating of the through hole is 20 to 30 μm, and the through hole diameter is 0.35 mm in diameter ($\varphi$), an allowable current is approximately 1 to 2 [A/piece].

To increase an allowable current amount, it is necessary to increase the thickness of the plating of the through hole. Unfortunately, plate processing generally requires approximately 1.5 to 2.5 hours per thickness of 10 μm. Thus, in order to increase the thickness of the plating of the through hole, it takes a lot of time in plate processing. In a case of embedding plating in a through hole by performing plate processing for a long time, a plating may not be uniformly deposited within the through hole due to effects of thickness of a substrate and so on, resulting in generation of voids enclosing plating solution. This can deteriorate reliability of the substrate and is this undesirable.

On the other hand, micromachining technology of a through hole has a limitation in fining a pitch of a through hole.

As in the substrate of the disclosure, a second base material is fitted into a first base material. The second base material includes multiple metal bodies. The metal bodies penetrate in the same direction as the thickness direction of the first base material in a state of having an end exposed at each of a first surface and a second surface that face each other in the thickness direction. This structure enables forming a high-current path in the thickness direction to a substrate without having plating of a through hole. Moreover, in producing the second base material, the metal bodies can be made by a photolithography technique. Use of the photolithography technique, which provides a degree of freedom greater in producing metal bodies than in plating of a through hole, enables narrowing spaces between multiple current paths.

<First Base Material>

The first base material has a sheet shape.

The first base material has a penetrating hole in the thickness direction.

The first base material may include a patterned circuit on its surface or inside.

An example of the material of this circuit includes metal, such as copper or nickel.

The shape of this circuit is not specifically limited and can be appropriately selected in accordance with the purpose.

This circuit may have a single-layer structure or a multi-layer structure.

The first base material is, for example, a substrate including a patterned circuit that is formed at least one of on a surface and inside of an insulating base material.

The insulating base material of the first base material is not specifically limited on the condition that it can be used in a circuit board, such as a printed circuit board, and the insulating base material can be appropriately selected in accordance with the purpose. An example of this insulating base material includes a base material that is hardened by an inorganic base material such as an inorganic woven fabric or an inorganic nonwoven fabric, or an organic base material such as an organic woven fabric or an organic nonwoven fabric, each which uses a glass cloth or the like.

More specifically, examples of the insulating base material include glass epoxy base materials (glass woven fabric base material impregnated with epoxy resin and glass nonwoven fabric base material impregnated with epoxy resin), a glass woven fabric base material impregnated with bis-maleimide-triazine resin, an aramid nonwoven fabric base material impregnated with epoxy resin, and a glass woven fabric base material impregnated with modified polyphenylene ether resin.

The glass epoxy base material is a base material that is obtained by impregnating epoxy resin into a glass fiber fabric (woven fabric or nonwoven fabric).

The dimensions of the penetrating hole of the first base material are not specifically limited and can be appropriately selected in accordance with the dimensions of the second base material fitted into the penetrating hole.

The shape of the penetrating hole of the first base material is not specifically limited and can be appropriately selected in accordance with the shape of the second base material fitted into the penetrating hole.

The method for forming the penetrating hole of the first base material is not specifically limited and can be appropriately selected in accordance with the purpose. Examples of this method include laser processing and drilling.

<Second Base Material>

The second base material has a sheet shape, for example.

The second base material is fitted into the penetrating hole of the first base material.

The thickness direction of the first base material and the thickness direction of the second base material are in the same direction, for example.

The second base material includes multiple metal bodies. The metal bodies penetrate in the same direction as the thickness direction of the first base material in a state of being fitted into the first base material. The metal bodies each have an end exposed at each of a first surface and a second surface of the second base material that face each other in the thickness direction. That is, the ends of the metal body are respectively at the first surface and the second surface and do not protrude from the first surface and the second surface in the second base material.

The thickness of the first base material and the thickness of the second base material may be the same or different from each other, but they are preferably the same. That is, the second base material is preferably fitted into the first base material in order not to generate a step between the surfaces of the first base material and the second base material.

The surface shape of the exposed end of the metal body is not specifically limited and can be appropriately selected in accordance with the purpose. In one example in which the metal body is produced by photolithography using a photoresist, as described later, the surface shape of the exposed end of the metal body may be trapezoidal or hexagonal. Note that producing using photolithography can cause the trapezoidal or hexagonal shape of the exposed end to have vague corners.

The area of the exposed end of the metal body is not specifically limited and can be appropriately selected in accordance with the purpose. In one example, the area may be 0.01 to 10 mm$^2$, or the like.

The material of the metal body is not specifically limited and can be appropriately selected in accordance with the purpose. An example of this material includes metal such as copper or nickel.

The second base material is, for example, a substrate formed such that multiple metal bodies penetrate through a sheet-shaped insulating base material.

The insulating base material of the second base material is not specifically limited on the condition that it can be used in a circuit board, such as a printed circuit board, and the insulating base material can be appropriately selected in accordance with the purpose. An example of this insulating base material includes a base material that is hardened by an inorganic base material such as an inorganic woven fabric or an inorganic nonwoven fabric, or an organic base material such as an organic woven fabric or an organic nonwoven fabric, each which uses a glass cloth or the like.

More specifically, examples of the insulating base material include glass epoxy base materials (glass woven fabric base material impregnated with epoxy resin and glass nonwoven fabric base material impregnated with epoxy resin), a glass woven fabric base material impregnated with bismaleimide-triazine resin, an aramid nonwoven fabric base material impregnated with epoxy resin, and a glass woven fabric base material impregnated with modified polyphenylene ether resin.

The glass epoxy base material is a base material that is obtained by impregnating epoxy resin into a glass fiber fabric (woven fabric or nonwoven fabric).

In the second base material, spaces between the multiple metal bodies at the first surface and spaces between the multiple metal bodies at the second surface may differ from each other. This structure increases the degree of freedom between the pitch of terminals of a first electronic component connected to the metal bodies at the first surface and the pitch of terminals of a second electronic component connected to the metal bodies at the second surface.

The method for fitting the second base material into the penetrating hole of the first base material is not specifically limited and can be appropriately selected in accordance with the purpose.

The method for fixing the second base material to the penetrating hole of the first base material is not specifically limited and can be appropriately selected in accordance with the purpose. An example of this method includes a method of fixing the first base material and the second base material by adhesive, thermosetting resin, or the like.

The thickness of the second base material is not specifically limited and can be appropriately selected in accordance with the purpose. In one example, this thickness may be 1 to 20 mm, or the like.

The surface area of each of the first surface and the second surface of the second base material is not specifically limited and can be appropriately selected in accordance with the purpose. In one example, this surface area may be 100 to 10,000 mm$^2$, or the like.

The multiple metal bodies function as, for example, current paths for supplying current to electronic components.

The substrate is used, for example, to supply current via the metal bodies of the second base material from a converter to an electronic component (such as a semiconductor element).

(Electronic Device)

The electronic device of the disclosure includes at least the substrate of the disclosure and an electronic component, and moreover includes other components as necessary.

Examples of the electronic component include a semiconductor package, which is formed such that a semiconductor chip is mounted on a package substrate, and a converter. For example, the converter may be a DC-DC converter.

In one example, the electronic device includes the substrate of the disclosure, and a first electronic component and a second electronic component that are electrically connected via the metal bodies of the substrate.

Herein, for example, the first electronic component is a semiconductor package, which is formed such that a semiconductor chip is mounted on a package substrate, whereas the second electronic component is a converter.

The semiconductor package includes a package substrate and a semiconductor chip that is flip-chip connected to the package substrate via solder bumps. The package substrate and the substrate of the disclosure are connected to each other via bumps in a ball grid array (BGA).

In addition, the substrate of the disclosure and the converter are connected to each other via bumps in a BGA.

The electronic device may include many electronic components that are mounted on the substrate of the disclosure, in addition to the semiconductor package and the converter.

The type of the electronic device is not specifically limited and can be appropriately selected in accordance with the purpose. Examples of the electronic device include personal computers (laptop computer and desktop computer), a telephone, a cellular phone, a tablet portable terminal, a smart phone, a copying machine, a facsimile, each kind of printers, a digital camera, a television, a video machine, a CD machine, a DVD machine, an air conditioner, and a remote controller.

(Method for Manufacturing Substrate)

The method for manufacturing the substrate of the disclosure includes a fitting process and preferably includes a second base material producing process. Furthermore, this method also includes other processes as necessary.

<Fitting Process>

The method of the fitting process is not specifically limited on the condition that the process includes fitting the second base material into the penetrating hole in the thickness direction of the sheet-shaped first base material, and the method can be selected in accordance with the purpose. The fitting process may be performed automatically by using an apparatus or manually by using a jig.

<<First Base Material>>

The first base material has a sheet shape.

The first base material has a penetrating hole in the thickness direction.

The first base material may include a patterned circuit on its surface or inside.

An example of the material of this circuit includes metal, such as copper or nickel.

The shape of this circuit is not specifically limited and can be appropriately selected in accordance with the purpose.

This circuit may have a single-layer structure or a multi-layer structure.

An example of the first base material includes the first base material described in explanation of the substrate of the disclosure.

In fitting the second base material into the penetrating hole in the thickness direction of the sheet-shaped first base material, the second base material is preferably fixed to the penetrating hole of the first base material. The method of fixing the second base material to the penetrating hole of the first base material is not specifically limited and can be appropriately selected in accordance with the purpose. An example of this method includes a method of fixing the first base material and the second base material by adhesive, thermosetting resin, or the like.

<<Second Base Material>>

The second base material has a sheet shape, for example.

The thickness direction of the first base material and the thickness direction of the second base material are in the same direction, for example.

The second base material, which is fitted into the penetrating hole of the first base material, includes multiple metal bodies. The metal bodies penetrate in the same direction as the thickness direction of the first base material in a state of having an end exposed at each of a first surface and a second surface of the second base material that face each other in the thickness direction.

An example of the second base material includes the second base material described in explanation of the substrate of the disclosure.

<Second Base Material Producing Process>

An example of the second base material producing process includes a process of obtaining a second base material by cutting a third base material so as to cut a pattern wiring that is formed therein and that is to be used as the multiple metal bodies of the second base material.

The pattern wiring is formed inside the third base material.

The third base material is obtained, for example, by laminating multiple fourth base materials that each have a pattern wiring disposed on the surface.

The pattern wiring is disposed on the surface of the fourth base material.

The method for forming the pattern wiring on the surface of the fourth base material is not specifically limited and can be appropriately selected in accordance with the purpose. An example of this method includes photolithography using a photoresist.

The substrate of the disclosure and the method for manufacturing the substrate of the disclosure will be described by using the drawings.

Figure 1:
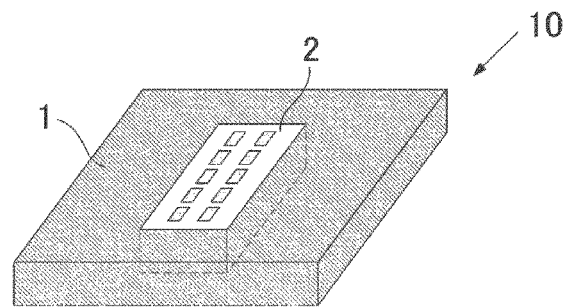
FIG. 1 is a schematic perspective view of an example of a substrate of the disclosure.

FIG. 1 is a schematic perspective view of an example of the substrate of the disclosure.

FIG. 1 shows a substrate 10 that includes a sheet-shaped first base material 1 and a second base material 2. The first base material 1 has a penetrating hole in the thickness direction. The second base material 2 is fitted into the penetrating hole of the first base material 1.

Figure 2A:
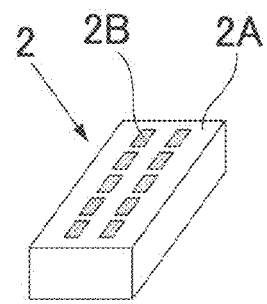
FIG. 2A is a schematic perspective view of an example of a second base material.
Figure 2B:
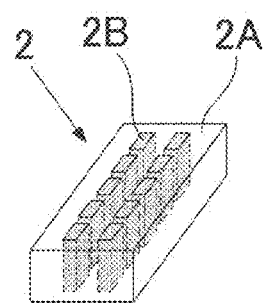
FIG. 2B is a schematic perspective view showing a state inside the second base material in FIG. 2A.

As shown in FIGS. 2A and 2B, the second base material 2 includes an insulating base material 2A and multiple metal bodies 2B. In the second base material 2, the multiple metal bodies 2B penetrate in the same direction as the thickness direction of the first base material 1 and each have an end that is exposed at each of a first surface and a second surface facing each other in the thickness direction. In FIG. 2B, the metal bodies 2B inside the insulating base material 2A are shown by dashed lines, in order to show the state of the metal bodies 2B formed inside the insulating base material 2A.

An example of the method of producing the second base material 2 will be described later.

An example of the method for manufacturing the substrate 10 in FIG. 1 will be described by using FIGS. 3A to 3C.

Figure 3A:
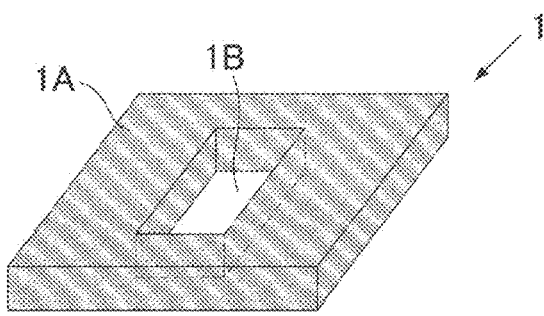
FIG. 3A is a schematic view for explaining an example of a method for manufacturing a substrate of the disclosure (Part 1).

First, the first base material 1 as shown in FIG. 3A is prepared. In the first base material 1, a penetrating hole 1B is formed in a sheet-shaped insulating base material 1A.

Figure 3B:
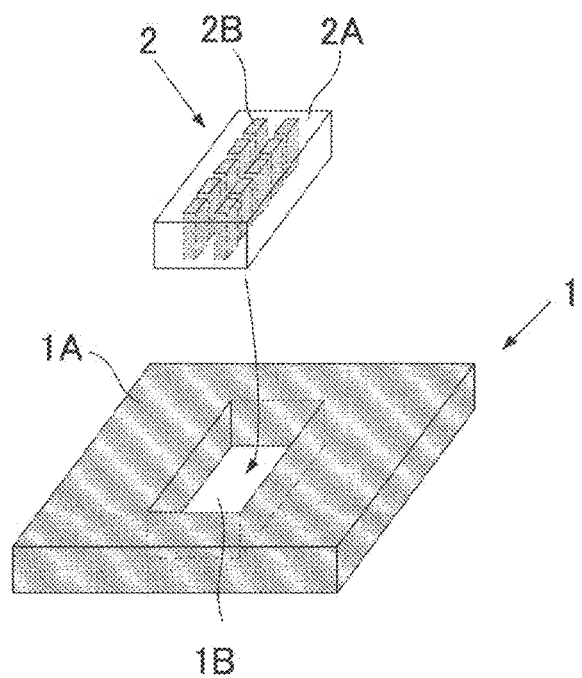
FIG. 3B is a schematic view for explaining the example of the method for manufacturing the substrate of the disclosure (Part 2).

Thereafter, as shown in FIG. 3B, the second base material 2 is fitted into the penetrating hole 1B of the first base material 1. In fitting the second base material 2 into the penetrating hole 1B of the first base material 1, the first base material 1 and the second base material 2 are preferably fixed by using adhesive, thermosetting resin, or the like.

Figure 3C:
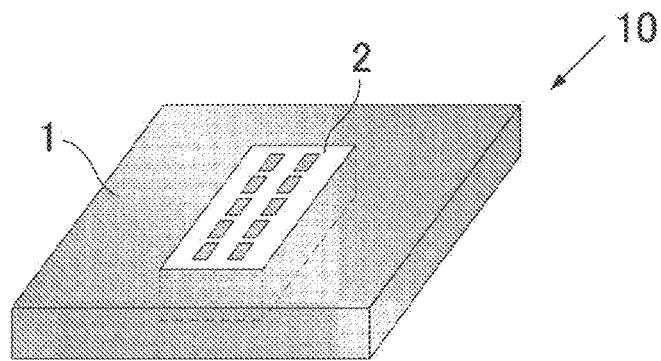
FIG. 3C is a schematic view for explaining the example of the method for manufacturing the substrate of the disclosure (Part 3).

Thus, the substrate 10 as shown in FIG. 3C is obtained.

Next, an example of the method of producing the second base material will be described by using the drawings.

The second base material is obtained, for example, by cutting a third base material so as to cut a pattern wiring that is formed therein.

Figure 4A:
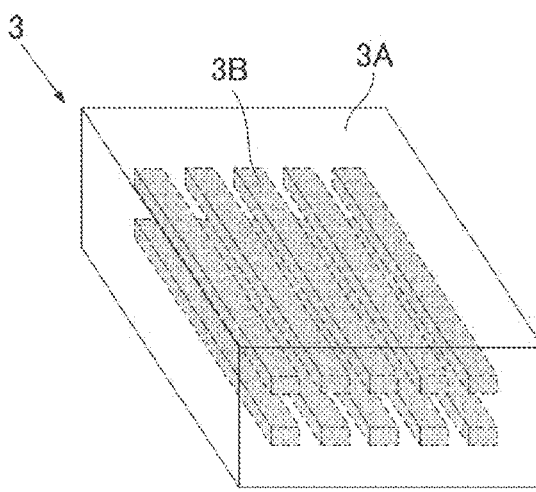
FIG. 4A is a schematic view for explaining an example of a method of producing a second base material (Part 1).
Figure 4B:
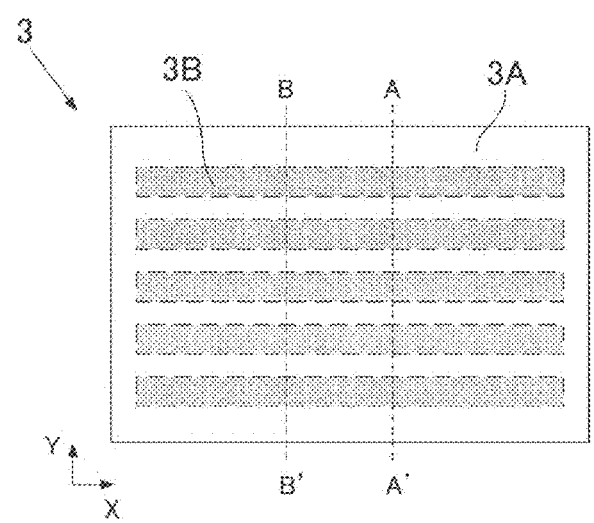
FIG. 4B is a schematic view for explaining the example of the method of producing the second base material (Part 2).
Figure 4C:
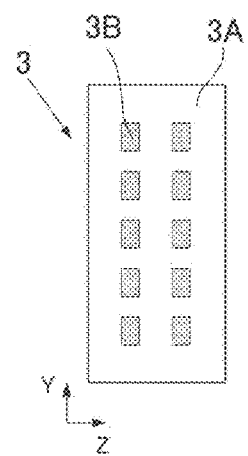
FIG. 4C is a schematic view for explaining the example of the method of producing the second base material (Part 3).

FIG. 4A is a schematic perspective view of an example of a third base material 3. FIG. 4B is a top view of the third base material in FIG. 4A. FIG. 4C is an A-A' cross sectional view of the third base material 3 in FIG. 4B. Note that FIG. 4B visualizes the inside pattern wiring by using dashed lines.

As shown in FIGS. 4A to 4C, the third base material 3 includes an insulating base material 3A and a pattern wiring 3B. The pattern wiring 3B is formed inside the insulating base material 3A.

The third base material 3 shown in FIGS. 4A to 4C is cut at an A-A' surface and a B-B' surface, whereby the second base material 2 shown in FIGS. 2A and 2B is obtained.

Next, an example of the method of producing the third base material will be described by using the drawings.

Figure 5A:
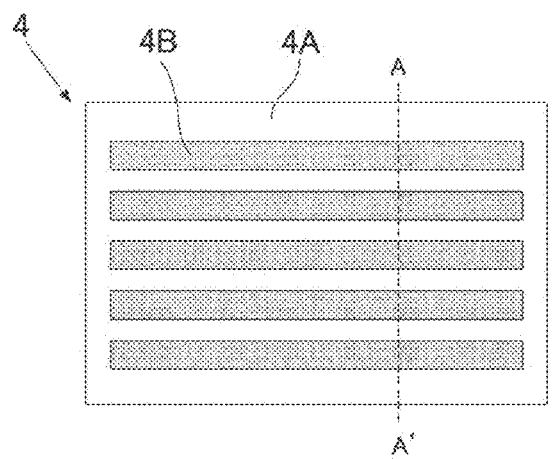
FIG. 5A is a schematic view for explaining an example of a method of producing a third base material (Part 1).
Figure 5B:
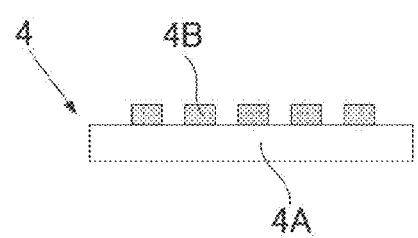
FIG. 5B is a schematic view for explaining the example of the method of producing the third base material (Part 2).

First, a fourth base material 4 is prepared. FIG. 5A is a top view of an example of the fourth base material 4. FIG. 5B is an A-A' cross sectional view of the fourth base material 4 in FIG. 5A. In the fourth base material 4 shown in FIG. 5A, a wiring pattern 4B is formed on a surface of an insulating base material 4A.

Figure 5C:
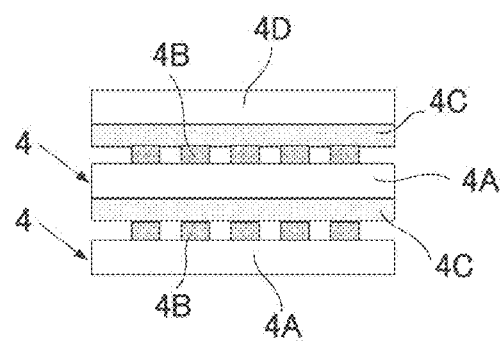
FIG. 5C is a schematic view for explaining the example of the method of producing the third base material (Part 3).

Then, the fourth base materials 4 shown in FIGS. 5A and 5B are laminated by interposing therebetween a precursor 4C (for example, B stage pre-preg) of the insulating base material. Moreover, an insulating base material 4D is disposed on the uppermost layer (FIG. 5C).

Figure 5D:
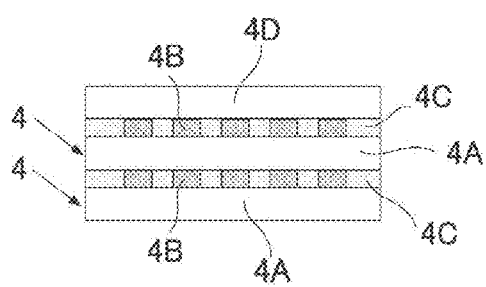
FIG. 5D is a schematic view for explaining the example of the method of producing the third base material (Part 4).

Thermo-compression bonding is then performed, whereby a laminated body is obtained (FIG. 5D). The temperature and the pressure of the thermo-compression bonding are not specifically limited and can be appropriately selected in accordance with the purpose.

Figure 5E:
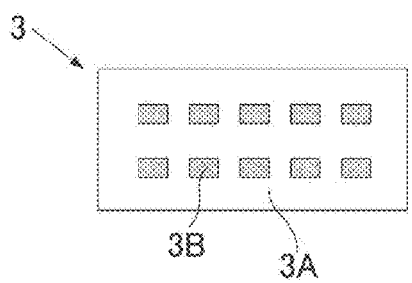
FIG. 5E is a schematic view for explaining the example of the method of producing the third base material (Part 5).

In the laminated body in FIG. 5D, the precursor 4C of the insulating base material is thermally cured to be combined with the insulating base materials 4A and 4D. As a result, the third base material 3 shown in FIG. 5E is finally obtained. FIG. 5E is a sectional view of the resultant third base material 3.

Figure 6A:
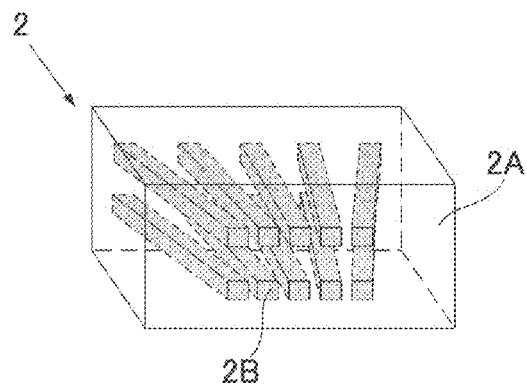
FIG. 6A is a schematic perspective view of another example of the second base material.

FIG. 6A is a schematic perspective view of an example of the second base material 2.

In the second base material 2 in FIG. 6A, spaces between the multiple metal bodies at the first surface and spaces between the multiple metal bodies at the second surface differ from each other.

Figure 6B:
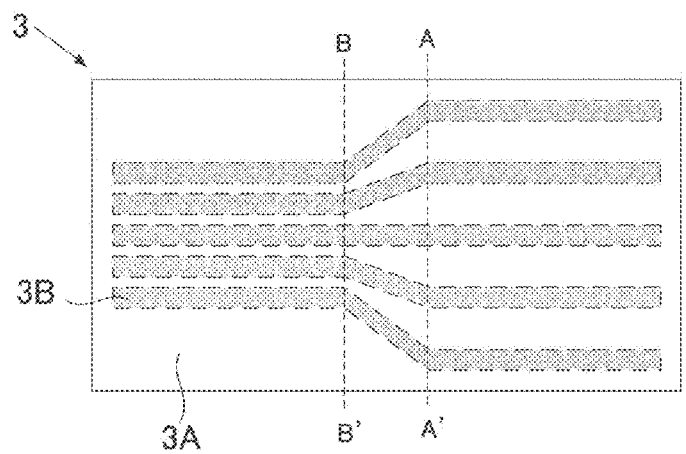
FIG. 6B is a top view of an example of the third base material.

The second base material 2 shown in FIG. 6A is obtained, for example, by cutting the third base material 3 shown in FIG. 6B at an A-A' surface and a B-B' surface.

FIG. 6B is a top view of an example of the third base material 3. Note that FIG. 6B visualizes the inside pattern wiring by using dashed lines.

In the third base material 3 shown in FIG. 6B, spaces of the pattern wiring 3B, which is formed inside the insulating base material 3A, change in the middle. Cutting these changing parts provides the second base material in which the spaces between the multiple metal bodies at the first surface and the spaces between the multiple metal bodies at the second surface differ from each other, as shown in FIG. 6A.

Figure 7:
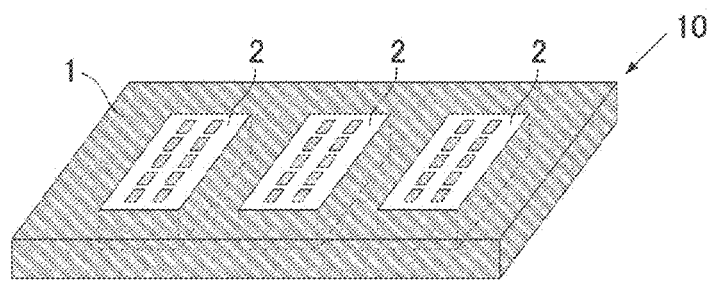
FIG. 7 is a schematic perspective view of another example of the substrate of the disclosure.

FIG. 7 shows a schematic perspective view of another example of the substrate of the disclosure.

FIG. 7 shows the substrate 10 having three penetrating holes that are formed in the first base material 1 and including the second base material 2 that is fitted into each of the three penetrating holes. Note that although FIG. 7 shows three second base materials 2 having the same shape and dimensions, the three second base material 2 may have different shapes and dimensions.

Figure 8:
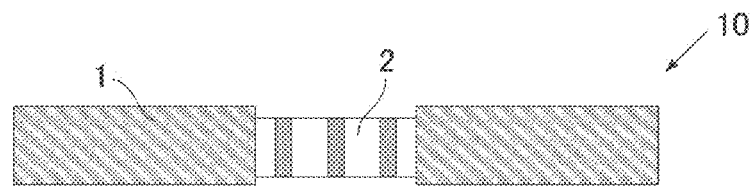
FIG. 8 is a schematic sectional view of another example of the substrate of the disclosure.

FIG. 8 shows a schematic sectional view of another example of the substrate of the disclosure.

FIG. 8 shows the substrate 10 including the sheet-shaped first base material 1 and the second base material 2. The second base material 2 is fitted into a penetrating hole of the first base material 1. Herein, the thickness of the first base material 1 and the thickness of the second base material 2 differ from each other, which generates a step between the surfaces of the first base material 1 and the second base material 2.

Figure 9:
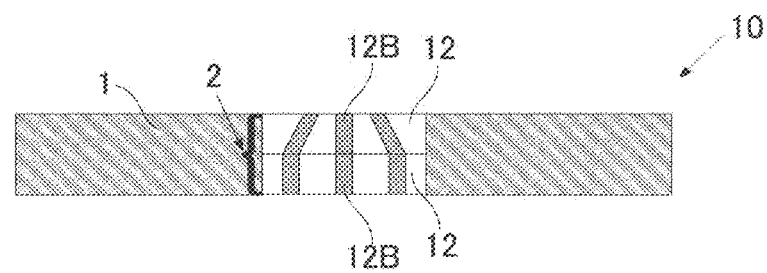
FIG. 9 is a schematic sectional view of another example of the substrate of the disclosure.

FIG. 9 shows a schematic sectional view of another example of the substrate of the disclosure.

FIG. 9 shows the substrate 10 including the sheet-shaped first base material 1 and the second base material 2. The second base material 2 is divided into two blocks 12. The two blocks 12 differ from each other in the wiring state of inside metal bodies 12B. The two blocks 12 are laminated on one another to constitute one second base material 2. Each of the blocks 12 can be produced, for example, by the same method as the method of producing the second base material 2. The two blocks 12 may be bonded by adhesive, thermo-setting resin, or the like, for example.

Each of the substrate that is formed by the method for manufacturing the substrate of the disclosure and the substrate of the disclosure can also be used as a motherboard (support board) or an interposer (relay board), or moreover, a circuit board for constituting a semiconductor element.

Figure 10:
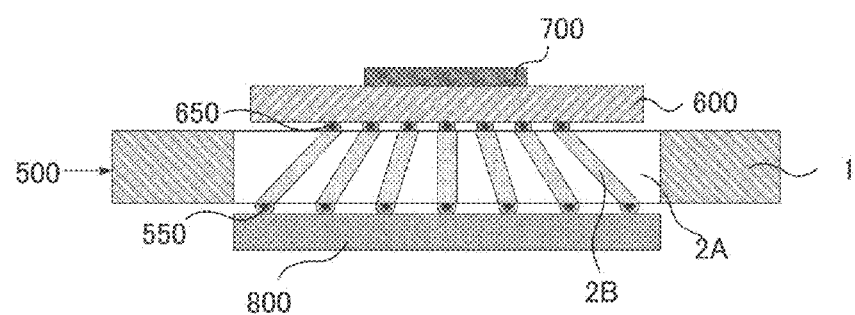
FIG. 10 is a schematic sectional view of a package.

FIG. 10 shows a schematic sectional view of a package. FIG. 10 shows an electronic device that includes a motherboard 500 having solder balls 550, an interposer 600 connected on the motherboard 500 via bumps 650, and a semiconductor element 700 disposed on the interposer 600. In addition, the package includes a converter 800 that is connected via the solder balls 550. An example of the semiconductor element 700 includes a field programmable gate array (FPGA) chip.

In FIG. 10, the motherboard 500 is the substrate that is formed by the method for manufacturing the substrate of the disclosure or the substrate of the disclosure, and the motherboard 500 includes the first base material 1 and a second base material. The second base material includes the insulating base material 2A and the metal bodies 2B.

Herein, each of the substrate that is formed by the method for manufacturing the substrate of the disclosure and the substrate of the disclosure can also be used as the interposer 600 in FIG. 10.

In relation to the embodiments described above, supplementary notes are also disclosed below.

(Supplementary Note 1)

A substrate characterized by comprising:

a sheet-shaped first base material having a penetrating hole in a thickness direction; and a second base material fitted into the penetrating hole, the second base material including multiple metal bodies, the metal bodies penetrating in the same direction as the thickness direction of the first base material in a state of having an end exposed at each of a first surface and a second surface of the second base material that face each other in the thickness direction.

(Supplementary Note 2)

The substrate according to Supplementary Note 1, wherein spaces between the multiple metal bodies at the first surface and spaces between the multiple metal bodies at the second surface differ from each other.

(Supplementary Note 3)

The substrate according to Supplementary Note 1 or 2, wherein the metal body is made of copper.

(Supplementary Note 4)

The substrate according to any one of Supplementary Notes 1 to 3, wherein the first base material includes a pattern wiring.

(Supplementary Note 5)

The substrate according to any one of Supplementary Notes 1 to 4, wherein the multiple metal bodies function as current paths for supplying current to an electronic component.

(Supplementary Note 6)

An electronic device characterized by comprising the substrate according to any one of Supplementary Notes 1 to 5 and an electronic component.

(Supplementary Note 7)

A method for manufacturing a substrate, characterized by comprising fitting a second base material into a penetrating hole in a thickness direction of a sheet-shaped first base material, the second base material, which is fitted into the penetrating hole of the first base material, including multiple metal bodies, the metal bodies penetrating in the same direction as the thickness direction of the first base material in a state of having an end exposed at each of a first surface and a second surface of the second base material that face each other in the thickness direction.

(Supplementary Note 8)

The method for manufacturing the substrate according to Supplementary Note 7, further comprising cutting a third base material so as to cut a pattern wiring that is formed inside the third base material and that is to be used as the multiple metal bodies of the second base material, whereby the second base material is obtained.

(Supplementary Note 9)

The method for manufacturing the substrate according to Supplementary Note 8, further comprising laminating multiple fourth base materials that each have the pattern wiring disposed on a surface, whereby the third base material is obtained.

What is claimed is:

1. A substrate characterized by comprising:

a sheet-shaped first base material having a penetrating hole in a thickness direction; and a second base material fitted into the penetrating hole, the second base material including multiple metal bodies, the metal bodies penetrating in the same direction as the thickness direction of the first base material and formed as a pattern wiring inside the first base material in a state of having an end exposed at each of a first surface and a second surface of the second base material that face each other in the thickness direction, and spaces between the multiple metal bodies at the first surface and spaces between the multiple metal bodies at the second surface differing from each other in such a manner that spaces of the pattern wiring formed inside the first base material change in a middle.

2. The substrate according to claim 1, wherein the metal body is made of copper.

3. The substrate according to claim 1, wherein the first base material includes the pattern wiring.

4. The substrate according to claim 1, wherein the multiple metal bodies function as current paths for supplying current to an electronic component.

5. An electronic device characterized by comprising the substrate according to claim 1 and an electronic component.

6. A method for manufacturing a substrate, characterized by comprising fitting a second base material into a penetrating hole in a thickness direction of a sheet-shaped first base material, the second base material, which is fitted into the penetrating hole of the first base material, including multiple metal bodies, the metal bodies penetrating in the same direction as the thickness direction of the first base material and formed as a pattern wiring inside the first base material in a state of having an end exposed at each of a first surface and a second surface of the second base material that face each other in the thickness direction; and cutting the first base material at a part at which spaces of a pattern wiring that is formed inside the first base material and that is to be used as the multiple metal bodies of the second base material change in a middle, the pattern wiring being formed inside the first base material in such a manner that the spaces of the pattern wiring change in the middle, whereby a third base material is obtained.

7. The method for manufacturing the substrate according to claim 6, further comprising laminating multiple fourth base materials that each have the pattern wiring disposed on a surface, whereby the third base material is obtained.

* * * * *

UNITED STATES PATENT AND TRADEMARK OFFICE
CERTIFICATE OF CORRECTION

| | | |
|---|---|---|
| PATENT NO. | : 12,114,433 B2 | Page 1 of 1 |
| APPLICATION NO. | : 17/635756 | |
| DATED | : October 8, 2024 | |
| INVENTOR(S) | : Nakano et al. | |

It is certified that error appears in the above-identified patent and that said Letters Patent is hereby corrected as shown below:

On the Title Page

Item (73) Assignee:
FUJITSU INTERCONNECT TECHNOLOGIES LIMITED, Nagano, JP

Should read as:
FICT LIMITED, Nagano, JP

Signed and Sealed this
First Day of April, 2025

Coke Morgan Stewart
*Acting Director of the United States Patent and Trademark Office*